United States Patent
Shin et al.

(10) Patent No.: US 10,373,821 B2
(45) Date of Patent: Aug. 6, 2019

(54) SUBSTRATE PROCESSING METHOD

(71) Applicant: JUSUNG ENGINEERING CO., LTD., Gwangju-si, Gyeonggi-do (KR)

(72) Inventors: Seung Chul Shin, Gwangju-si (KR); Jin Hyuk Yoo, Gwangju-si (KR); Min Ho Cheon, Daejeon (KR); Chul-Joo Hwang, Seongnam-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 0 days.

(21) Appl. No.: 15/531,734

(22) PCT Filed: Dec. 7, 2015

(86) PCT No.: PCT/KR2015/013286
§ 371 (c)(1),
(2) Date: May 30, 2017

(87) PCT Pub. No.: WO2016/093564
PCT Pub. Date: Jun. 16, 2016

(65) Prior Publication Data
US 2017/0345647 A1  Nov. 30, 2017

(30) Foreign Application Priority Data
Dec. 8, 2014 (KR) .................. 10-2014-0174674

(51) Int. Cl.
*H01L 21/02* (2006.01)
*H01L 21/205* (2006.01)
(Continued)

(52) U.S. Cl.
CPC ...... *H01L 21/02274* (2013.01); *C23C 16/402* (2013.01); *C23C 16/4408* (2013.01); *C23C 16/52* (2013.01); *C23C 16/56* (2013.01); *H01J 37/3244* (2013.01); *H01L 21/0228* (2013.01); *H01L 21/02164* (2013.01); *H01L 21/205* (2013.01)

(58) Field of Classification Search
CPC combination set(s) only.
See application file for complete search history.

(56) References Cited

U.S. PATENT DOCUMENTS

2005/0239298 A1*  10/2005  Damlencourt .......... C23C 16/14
                                                                438/785
2009/0104790 A1*  4/2009  Liang .................... C23C 16/34
                                                                438/788

(Continued)

FOREIGN PATENT DOCUMENTS

KR   20080089901 A   10/2008
KR   20080106984 A   12/2008

(Continued)

*Primary Examiner* — Ratisha Mehta
(74) *Attorney, Agent, or Firm* — Renaissance IP Law Group LLP (57) ABSTRACT

Disclosed is a substrate processing method including gas injection including a source material containing silicon towards substrates received in a reaction chamber, depositing the source material on the substrates by generating plasma including oxygen radicals so as to form deposition films, and executing surface treatment of the deposition films by injecting plasma gas including oxygen radicals.

16 Claims, 4 Drawing Sheets

(51) Int. Cl.
  *H01J 37/32*   (2006.01)
  *C23C 16/40*   (2006.01)
  *C23C 16/44*   (2006.01)
  *C23C 16/52*   (2006.01)
  *C23C 16/56*   (2006.01)

(56) References Cited

U.S. PATENT DOCUMENTS

| | | | |
|---|---|---|---|
| 2013/0008381 A1* | 1/2013 | Fukumori | B01D 8/00 118/715 |
| 2013/0020706 A1* | 1/2013 | Furuhashi | H01L 21/76885 257/741 |
| 2013/0101752 A1* | 4/2013 | Kim | C23C 16/345 427/539 |
| 2014/0083362 A1 | 3/2014 | Lubomirsky et al. | |
| 2017/0148625 A1* | 5/2017 | Kim | H01L 21/0228 |

FOREIGN PATENT DOCUMENTS

| | | |
|---|---|---|
| KR | 20130139651 A | 12/2013 |
| KR | 20140015421 A | 2/2014 |
| TW | 200929360 A | 7/2009 |
| TW | 201220397 A | 5/2012 |

* cited by examiner

SUBSTRATE PROCESSING METHOD

TECHNICAL FIELD

Embodiments relate to a substrate processing method in which required density and step coverage may be satisfied and generation of voids may be remarkably reduced.

BACKGROUND ART

Contents described herein provide only background information of embodiments but do not constitute prior art.

In general, a semiconductor memory device, a liquid crystal display device, an organic light emitting device, etc. are fabricated by depositing and stacking structures of a desired shape by repeating a semiconductor process on a substrate a plurality of times.

Semiconductor fabrication includes a process of a depositing a designated thin film on a substrate, a photolithography process for exposing selected regions of the thin film, an etching process for removing the thin film from the selected regions, etc. Such semiconductor fabrication is carried out within a reaction chamber in which optimal conductions for the corresponding process are realized.

The substrate deposition process is executed using chemical vapor deposition (CVD) or atomic layer deposition.

In CVD, since a deposition film is formed on a substrate by injecting process gas for deposition onto the substrate, CVD has high deposition speed but has low uniformity and quality of the deposition film, as compared to atomic layer deposition.

In atomic layer deposition, since a deposition film is formed on a substrate through atomic layer adsorption by sequentially injecting source gas, purge gas, reaction gas and purge gas onto the substrate, atomic layer deposition is advantageous in that the deposition film is uniformly deposited on the substrate but has low deposition speed.

As high integration of devices formed on a substrate and production of a substrate having a 3D structure are required, the substrate deposition process requires formation of a deposition film having uniform and high density and high uniformity in deposition, i.e., high step coverage.

Particularly, if a gap-filling process for filling gaps formed on a substrate having a 3D structure by stacking a plurality of deposition films during production of the substrate is executed, undesirable voids may be generated in regions where the deposition films are combined integrally.

Since generation of such voids causes defects in operating characteristics of a semiconductor product, semiconductor products having voids should be discarded and, thus, a substrate processing method for reducing generation of voids is required.

DISCLOSURE

Technical Problem

Thus, embodiments provide a substrate processing method in which required density and step coverage may be satisfied and generation of voids may be remarkably reduced.

Technical Solution

In one embodiment, a substrate processing method includes gas injection including a source material containing silicon towards substrates received in a reaction chamber, depositing the source material on the substrates by generating plasma including oxygen radicals so as to form deposition films, and executing surface treatment of the deposition films by injecting plasma gas including oxygen radicals.

In one embodiment, the substrates provided in plural may be processed within one reaction chamber.

The reaction chamber may include a substrate support unit rotated and having a plurality of substrates symmetrically mounted thereon, a lid spaced from the upper surface of the substrate support unit, gas injection units installed on the lid, and a plasma generation unit installed on the lid so as to be separated from the gas injection units.

The gas injection units may include a first injection unit configured to inject the gas including the source material and a second injection unit configured to divide the space of the reaction chamber and to inject gas for purging the reaction chamber.

Effects of Invention

In the embodiment, deposition films may shrink by repeatedly injecting plasma gas onto the deposition films in surface treatment. Therefore, as the deposition films shrink, the density of the deposition films may be increased. Further, as the deposition films shrink, some of fine air bubbles present within the deposition films or on the surfaces of the deposition films may be removed and uniformity in deposition of the deposition films, i.e., step coverage of the deposition films, may be increased.

Further, if the deposition films have undergone surface treatment, the deposition films formed on the upper part of a gap are more thin and denser than the deposition films formed on the lower part of the gap. Such a structure may suppress generation of voids during the gap-filling operation.

BEST MODE

Hereinafter, embodiments will be described with reference to the annexed drawings. These embodiments may be variously modified but specific embodiments will be exemplarily described with reference to the annexed drawings. However, the embodiments are not limited thereto but may cover all modifications, variations and equivalents within the scope of the embodiments. Here, the sizes or shapes of elements shown in the drawings may be exaggerated for clarity and convenience in description.

Further, the terms "first", "second", etc., may be used to describe various elements but the elements are not limited by these terms. The terms are used only to distinguish one element from other elements. In addition, the terms specifically defined in consideration of the configurations and functions of the embodiments are only to describe the embodiments but do not limit the ranges of the embodiments.

In the following description of the embodiments, it will be understood that, when each element is referred to as being formed "on" or "under" the other element, it can be directly "on" or "under" the other element or be indirectly formed with one or more intervening elements therebetween. In addition, it will also be understood that "on" or "under" the element may mean the upward direction and the downward direction of the element.

Further, the relational terms "on/above/upper" and "under/below/lower", etc. used in description of the embodiments do not necessarily require or imply physical or logical relations between substances and elements or the order thereof but may be used only to distinguish one substance or element from other substances or elements.

Figure 1:
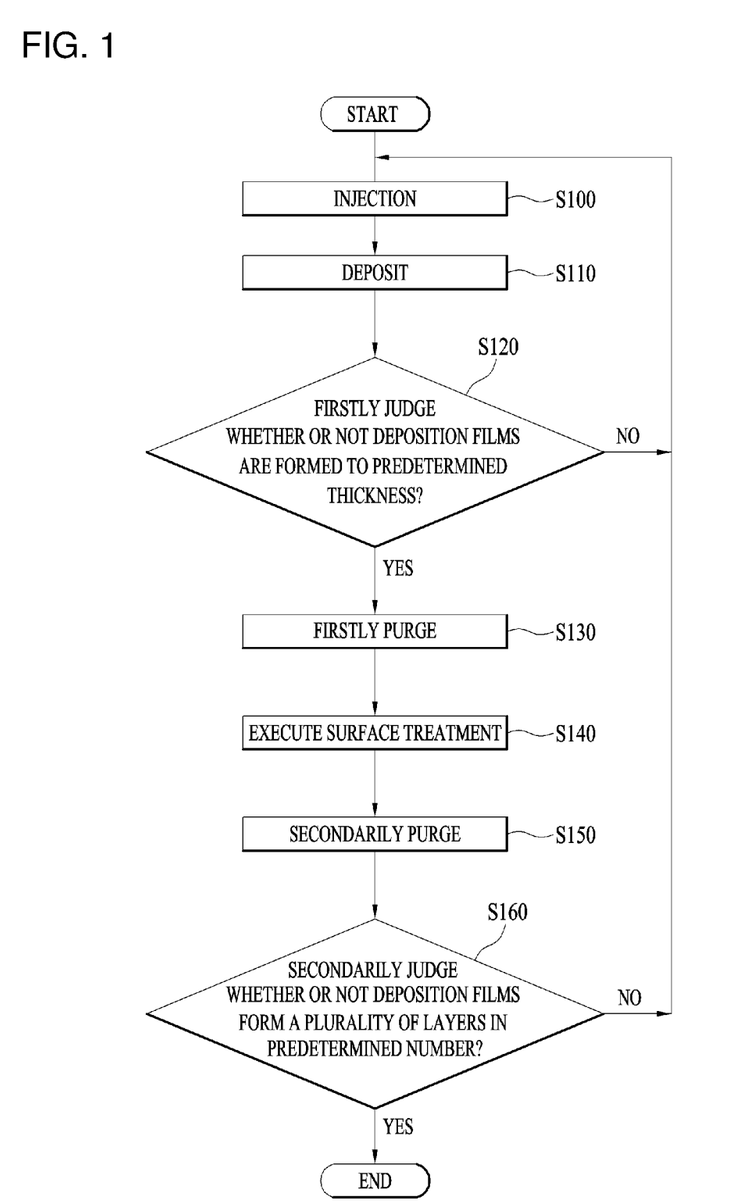
FIG. 1 is a flowchart illustrating a substrate processing method in accordance with one embodiment.
Figure 2:
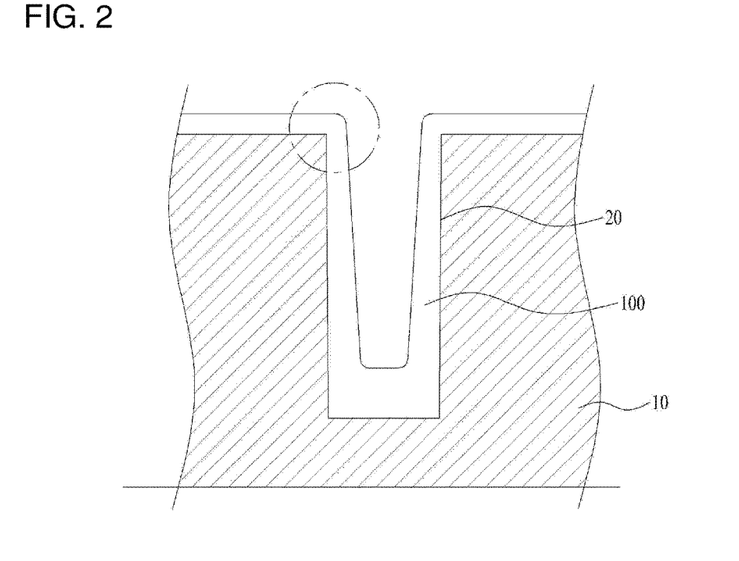
FIG. 2 is a cross-sectional view illustrating the shape of a deposition film deposited on a gap of a substrate after surface treatment in accordance with one embodiment.
Figure 3:
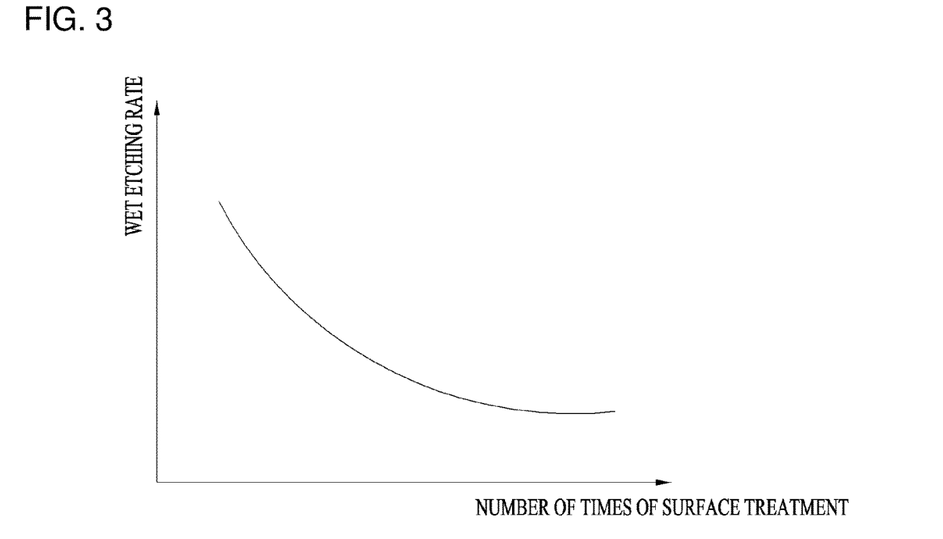
FIG. 3 is a graph illustrating relations between the number of times of surface treatment and a wet etching rate in surface treatment in accordance with one embodiment.

FIG. 1 is a flowchart illustrating a substrate processing method in accordance with one embodiment. FIG. 2 is a cross-sectional view illustrating the shape of a deposition film 100 deposited on a gap 20 of a substrate 10 (with reference to FIG. 6) after surface treatment in accordance with one embodiment. FIG. 3 is a graph illustrating relations between the number of times of surface treatment and a wet etching rate in surface treatment in accordance with one embodiment.

The substrate processing method in accordance with one embodiment includes, as exemplarily shown in FIG. 1, injection (Operation S100), deposition (Operation S110), first judgment (Operation S120), first purge (Operation S130), surface treatment (Operation S140), second purge (Operation S150), and second judgment (Operation S160).

Figure 6:
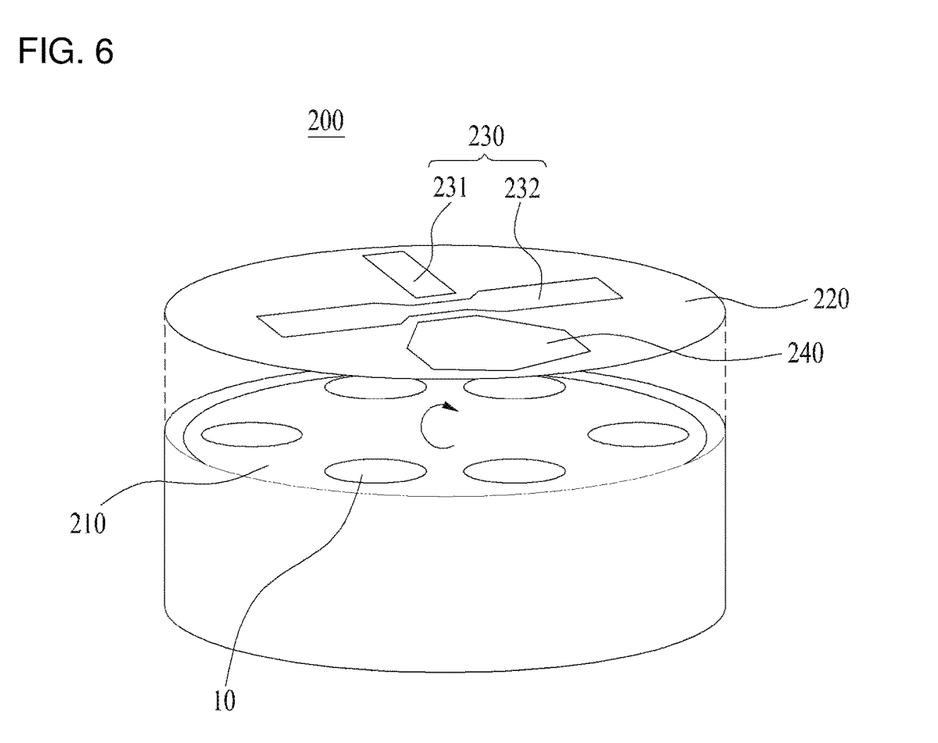
FIG. 6 is a view schematically illustrating a reaction chamber used in a substrate processing method in accordance with one embodiment.

In injection (Operation S100), gas including a source material containing silicon may be injected onto substrates 10 received in a reaction chamber 200 (with reference to FIG. 6). Such a source material is a material for forming deposition films 100 and, in accordance with the embodiment, a source material to form a silicon oxide, for example, $SiH_4$, etc., may be used.

Here, the gas including the source material may be supplied from the outside of the reaction chamber 200, a storage unit for the source material for forming the deposition films 100 and a storage unit for process gas for conveying the source material may be separated from each other and the source material and the process gas are mixed and introduced into the reaction chamber 200.

The process gas may be gas formed of components required to process the substrates 10, in addition to the function of conveying the source material. For example, the process gas may be reaction gas, such as $O_2$ or $O_3$, or purge gas, such as Ar or $N_2$.

In deposition (Operation S110), plasma including oxygen radicals may be generated within the reaction chamber 200 and the deposition films 100 may be formed on the substrates 10 received within the reaction chamber 200 by depositing the source material on the substrates 10.

In deposition (Operation S110), the source material forms a silicon oxide and thus the deposition films 100 may be silicon oxide films. Here, in deposition (Operation S110) the deposition films 100 may be formed on the substrate 10 using plasma deposition. Further, in deposition (Operation S110), thermal deposition may be additionally used.

In plasma deposition, gas to generate plasma, for example, reaction gas, such as $O_2$ or $O_3$, may be introduced into the reaction chamber 200 as the process gas. $O_2$ or $O_3$ introduced into the reaction chamber 200 may be separated into ions by a plasma generation unit installed in the reaction chamber 200, thus generating plasma.

In thermal deposition, the source material and the process gas may be heated prior to introduction of the source material and the process gas into the reaction chamber 200 or heated by a heating device disposed in the reaction chamber 200 after introduction of the source material and the process gas into the reaction chamber 200.

A structure of the reaction chamber 200 in accordance with one embodiment will be described later in more detail with reference to FIG. 6.

In deposition (Operation S110), both thermal deposition and plasma deposition may be simultaneously used and, more properly, a thermal plasma atomic layer deposition method may be used, and, for example, $O_2$ and $O_3$ may be mixed and used as plasma generation gas.

In first judgment (Operation S120), whether or not the deposition films 100 are formed to a predetermined thickness is judged. The thickness of the deposition films 100 may be properly set in consideration of a material of the deposition films 100, a thickness of the deposition films 100 after shrinkage during surface treatment, the number of plural deposition films 100, a width of gaps formed on the deposition region of the substrate 10, etc.

In first judgment, if the thickness of the deposition films 100 is smaller than the predetermined thickness, the substrate processing method may return to injection (Operation S100) and deposition is continuously carried out until the deposition films 100 reach the predetermined thickness. Here, in order to judge whether or not the deposition films 100 are formed to the predetermined thickness, the thickness of the deposition films 100 may be measured. For the purpose of rapid operation, the thickness of the deposition films 100 may be properly measured using automation equipment.

Further, upon judging that the deposition films 100 reach the predetermined thickness in first judgment, first purge may be executed.

In first purge (Operation S130), purge gas may be injected into the reaction chamber 200 so as to purge the inside of the reaction chamber 200, upon judging that the deposition films 100 reach the predetermined thickness.

Here, the purge gas may be introduced into the reaction chamber 200 and thus discharge the remaining source material without formation of the deposition films 100 in the reaction chamber 200 to the outside of the reaction chamber 200. As described above, inert gas, such as Ar or $N_2$, may be used as the purge gas.

In surface treatment (Operation S140), plasma gas may be injected onto the deposition films 100 so as to execute surface treatment of the deposition films 100. In surface treatment (Operation S140), the plasma gas may be repeatedly spayed onto the deposition films 100.

Here, in surface treatment, surface treatment may be executed by plasma using a material including oxygen radicals. For example, $O_2$, $O_3$, NO, etc. may be used as the material including oxygen radicals.

In surface treatment, the plasma gas may be repeatedly injected onto the deposition films 100 so as to shrink the deposition films 100. Therefore, as the deposition films 100 shrink, the deposition films 100 may become more hardened and thus the density of the deposition films 100 may be increased.

Further, as the deposition films 100 shrink, the wet etching rate of the deposition films 100 may be lowered and thus durability of the deposition films 100 may be increased. The wet etching rate will be described later in more detail with reference to FIG. 3.

Further, as the deposition films 100 shrink, some of fine air bubbles present within the deposition films 100 or on the surfaces of the deposition films 100 may be removed and uniformity in deposition of the deposition films 100, i.e., step coverage of the deposition films 100, may be increased.

Surface treatment may be repeated by repeatedly injecting the plasma gas onto the deposition films 100 until the deposition films 100 reach the predetermined density and step coverage.

FIG. 3 is a graph illustrating relations between the number of times of surface treatment and a wet etching rate in surface treatment in accordance with one embodiment. The wet etching rate indicates, if the deposition film 100 is soaked in an etching solution, an etching degree of the deposition film 100 at a specific time. Therefore, as the wet etching rate decreases, chemical resistance and durability of the deposition films 100 may increase.

If the wet etching rate is high, the density of the deposition films 100 is low and, if the wet etching rate is low, the density of the deposition films 100 is high. Therefore, the wet etching rate and the density of the deposition films 100 are inversely proportional to each other.

As exemplarily shown in FIG. 3, as the number of times of surface treatment increases, the wet etching rate decreases. It may be proved that, as the number of times of surface treatment increases, the deposition films 100 become more hardened and the density of the deposition films increases. Therefore, in order to increase the density of the deposition films 100, the number of times of surface treatment may be increased.

However, if the number of times of surface treatment is increased, the speed of a formation process of the deposition films 100 decreases and, thereby, the speed of the deposition process on the entirety of the substrate 10 decreases. Therefore, the number of times of surface treatment may be properly selected in consideration of securing a high working speed and desired density and step coverage of the deposition film 100.

FIG. 2 is a cross-sectional view illustrating the shape of the deposition film 100, which has undergone surface treatment, deposited on a gap 20 of the substrate 10. In surface treatment (Operation S140), surface treatment of the deposition film 100 formed on the gap 20 of the substrate 10 may be executed.

As needed, as exemplarily shown in FIG. 2, gaps 20 may be formed on the upper surface of the substrate 10 and a gap-filling operation to fill the gaps 20 with the deposition film 100 may be executed in deposition (Operation S110).

Here, the thickness of the deposition films 100 formed on the lower part of the gap 20 may be greater than the deposition films 100 formed on the upper part of the gap 20 by surface treatment. The reason for this is that, in surface treatment, the plasma gas mainly reacts with the deposition films 100 formed on the upper part of the gap 20 and less reacts with the deposition films 100 deeply formed on lower part of the gap 20 than the deposition films 100 on the upper part of the gap 20.

That is, the upper part of the gap 20 is more exposed to the plasma gas than the lower part of the gap 20 and, thus, the deposition films 100 formed on the upper part of the gap 20 more actively shrink than the deposition films 100 formed on the lower part of the gap 20.

Therefore, if surface treatment has been executed, the deposition films 100 formed on the upper part of the gap 20 may be more thin and denser than the deposition films 100 formed on the lower part of the gap 20. Such a structure may suppress generation of voids V (with reference to FIG. 5) during the gap-filling operation. This will be described later in detail with reference to FIGS. 4 and 5.

In second purge (Operation S150), purge gas may be injected into the reaction chamber 200 so as to purse the inside of the reaction chamber 200. In the same manner as first purge (Operation S130), in second purge (Operation S150), the purge gas may be introduced into the reaction chamber 200 and thus discharge the remaining source material without formation of the deposition films 100 in the reaction chamber 200 to the outside of the reaction chamber 200. As described above, inert gas, such as Ar or $N_2$, may be used as the purge gas.

In second judgment (Operation S160), whether or not the deposition films 100 form a plurality of layers in a predetermined number is judged. In second judgment (Operation S160), if the deposition films 100 form a plurality of layers in a smaller number than the predetermined number, the substrate processing method may return to injection (Operation S100) and deposition (Operation S110) to second purge (Operation S150) may be repeatedly executed.

When the substrate processing method reaches second judgment via second purge, whether or not the deposition films 100 form a plurality of layers in the predetermined number is judged again. Upon judging that the deposition films 100 form a plurality of layers in the predetermined number, all above-described operations may be terminated.

Figure 4:
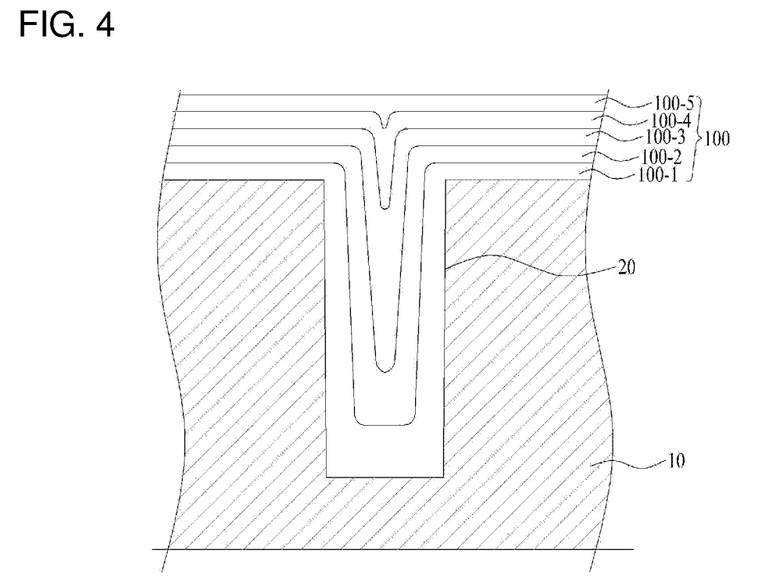
FIG. 4 is a cross-sectional view illustrating completion of formation of deposition films on a substrate having a gap by a substrate processing method in accordance with one embodiment.
Figure 5:
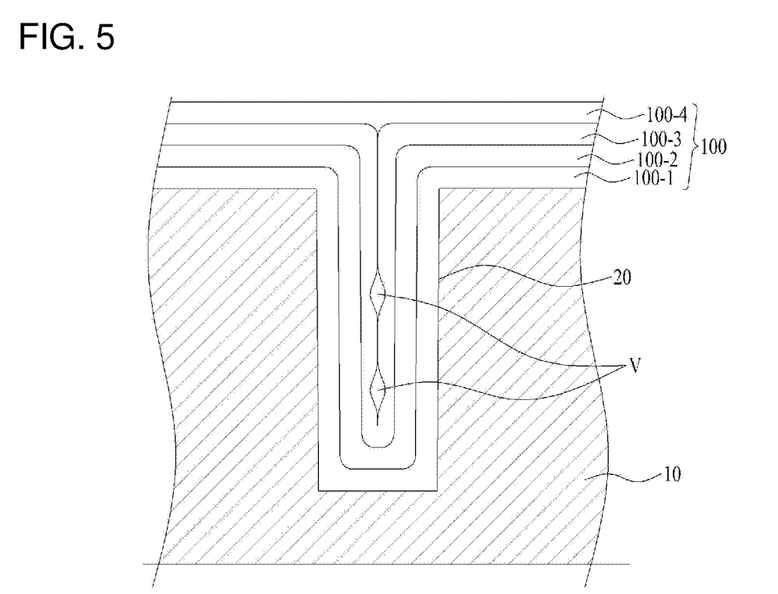
FIG. 5 is a cross-sectional view illustrating completion of formation of deposition films on a substrate having a gap by a general substrate processing method.

FIG. 4 is a cross-sectional view illustrating completion of formation of deposition films 100 on a substrate 10 having a gap 20 by a substrate processing method in accordance with one embodiment. FIG. 5 is a cross-sectional view illustrating completion of formation of deposition films 100 on a substrate 10 having a gap 20 by a general substrate processing method.

As exemplarily shown in FIG. 4, the substrate 10 includes the gap 20, the upper surface of which is opened, and a gap-filling operation to fill the gap 20 by forming the deposition films 100 having a plurality of layers on the surface of the gap 20 through the respective operations of the substrate processing method may be executed.

As described above with reference to FIG. 2, since the upper part of the gap 20 is more exposed to plasma gas than the lower part of the gap 20 in surface treatment, the deposition films 100 formed on the lower part of the gap 20 may have a greater thickness than the deposition films 100 formed on the upper part of the gap 20 through surface treatment.

As exemplarily shown in FIG. 4, the respective deposition films 100, for example, a first deposition film 100-1, a second deposition film 100-2, a third deposition film 100-3, a fourth deposition film 100-4 and a fifth deposition film 100-5, may be sequentially deposited and thus completely fill the gap 20, and then the gap-filling operation may be completed.

Although this embodiment describes 5 deposition films 100, the number of deposition films 100 may be 3 or less or 6 or more.

In the embodiment, except for the fifth deposition film 100-5, which is located at the uppermost position, the remaining deposition films 100-1, 100-2, 100-3 and 100-4 may be configured such that the thickness of each of the deposition films 100-1, 100-2, 100-3 and 100-4 formed on the lower part of the gap 20 is greater than the thickness of each of the deposition films 100-1, 100-2, 100-3 and 100-4 formed on the upper part of the gap 20 and the thickness of each of the deposition films 100-1, 100-2, 100-3 and 100-4 formed on the center of the gap 20 has a value between the thickness of each of the deposition films 100-1, 100-2, 100-3 and 100-4 formed on the lower part of the gap 20 and the thickness of each of the deposition films 100-1, 100-2, 100-3 and 100-4 formed on the upper part of the gap 20.

Owing to such a structure, the respective deposition films 100 on the lower part and the central part of the gap 20 may be pressed against each other at the interfaces thereamong due to large thicknesses of the deposition films 100, and be integrally combined without voids to fill the gap 20, thus completing the gap-filling operation.

Further, the deposition films 100 formed on the upper part of the gap 20 may sufficiently shrink in surface treatment and pressed against each other at the interfaces thereamong, thus being integrally combined without voids.

However, differently from the embodiment shown in FIG. 4, if a gap-filling operation is carried out by a general substrate processing method, as exemplarily shown in FIG. 5, for example, voids V may be formed at regions of one surface of a third deposition film 100-3 opposite the other surface of the third deposition film 100-3 forming the interface with a second deposition film 100-2.

In the case of the gap-filling operation exemplarily shown in FIG. 5, since surface treatment is not carried out, if the gap-filling operation is executed by sequentially depositing a first deposition film 100-1, the second deposition film 100-2, the third deposition film 100-3 and a fourth deposition film 100-4, the thicknesses of the deposition films 100-1, 100-2, 100-3 and 100-4 formed at the upper, central and lower parts of the gap 20 are equal.

Therefore, opposite parts of the other surface of the third deposition film 100-3 opposite the surface of the third deposition film 100-3 forming the interface with the second deposition film 100-2 are not sufficiently pressed against each other and, thus, the voids V may be formed between the opposite parts of the other surface of the third deposition film 100-3.

As described above with reference to FIGS. 4 and 5, in this embodiment, particularly, if the gap-filling operation is completed by forming the deposition films 100 on the substrate 10 via surface treatment, generation of voids at the center of the gap 20 is suppressed.

FIG. 6 is a view schematically illustrating the reaction chamber 200 used in the substrate processing method in accordance with one embodiment.

The reaction chamber 200 may include a substrate support unit 210, a lid 229, gas injection units 230, and a plasma generation unit. The reaction chamber 200 of the embodiment shown in FIG. 6 receives a plurality of substrates 10 and, thus, formation of deposition films 100 on the substrates 10 in one reaction chamber 200 may be executed.

The above-described substrate processing method may be executed in a reaction chamber (not shown) having a structure in which a substrate support unit is not rotated, differently from the embodiment shown in FIG. 6.

The substrates 10 may be mounted on the substrate support unit 210 so as to be symmetrical with respect to the center of the substrate support unit 210 and the substrate support unit 210 may be rotated. Here, the substrate support unit 210 may be supported by a rotary shaft (not shown) passing through the center of the bottom surface of the reaction chamber 200.

Although FIG. 6 illustrates the substrate support unit 210 as being rotated in the clockwise direction, the substrate support unit 210 may be rotated in the counterclockwise direction so that the deposition films 100 may be formed on the substrates 10.

Some of the substrates 10 mounted on the substrate support unit 210 may be spatially separated from the remaining substrates 10 by a second injection unit 232, which will be described later.

Therefore, the substrates 10, on which formation of the deposition films 100 to a predetermined thickness has been completed and then surface treatment is executed after deposition and first judgment, may be spatially separated from other substrates 10 and exposed to plasma by the plasma generation unit so as to execute surface treatment using the plasma.

The lid 220 may be spaced from the upper surface of the substrate support part 210 and serve to close the upper part of the reaction chamber 200. Further, the gas injection units 230 and the plasma generation unit may be installed on the lid 220 and, in this case, the lid 220 may serve as an electrode to supply power to the plasma generation unit.

The gas injection units 230 may be installed on the lid 220, serve to downwardly inject various kinds of process gases used in the substrate processing method toward the substrates 10 mounted on the substrate support unit 210, and include a first injection unit 231 and the second injection unit 232.

The first injection unit 231 may downwardly inject gas including a source material to form the deposition films 100 on the substrates 10 toward the substrates 10 mounted on the substrate support unit 210, thus executing deposition of the deposition films 100 on the substrates 10.

The second injection unit 232 may serve to divide the space of the reaction chamber 200 and to inject gas for purging the reaction chamber 200. Therefore, as the gas injected from the second injection unit 232, inert gas, for example, Ar or $N_2$, may be used, as described above.

Therefore, the second injection unit 232 may divide the space of the reaction chamber 200 and, if surface treatment using plasma is executed on the substrates 100 on which formation of the deposition films 100 has been completed via deposition and first judgment, serve to inject gas for dividing the space of the reaction chamber 200.

Thereby, for example, among two divided spaces formed by dividing the space of the reaction chamber 200 through the second injection unit 232, deposition in one divided space and surface treatment in the other divided space may be simultaneously executed.

Further, the second injection unit 232 may serve to inject purge gas for purging the remaining source material within the reaction chamber 200 during first purge and second purge.

The plasma generation unit may generate plasma using reaction gas, such as $O_2$ or $O_3$, if a plasma deposition method is used during deposition, and generate plasma using a material including oxygen radicals, for example, the above-described reaction gas, such as $O_2$, $O_3$ or NO, during surface treatment.

Here, if plasma is used during deposition, the second injection unit 232 may not be operated and deposition on all of the substrates 10 mounted on the substrate support unit 210 may be simultaneously executed.

Further, if plasma is used during deposition and the second injection unit 232 is operated, in order to generate plasma using reaction gas, such as $O_2$ or $O_3$, in a divided space in which deposition is executed, among divided spaces by the second injection unit 232, a separate plasma generation unit may be provided on the lid 220.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

In the embodiment, deposition films may shrink by repeatedly injecting plasma gas onto the deposition films in surface treatment. Therefore, as the deposition films shrink, the density of the deposition films may be increased. Further, as the deposition films shrink, some of fine air bubbles present within the deposition films or on the surfaces of the deposition films may be removed and uniformity in deposition of the deposition films, i.e., step coverage of the deposition films, may be increased. Thus there is industrial applicability.

The invention claimed is:

1. A substrate processing method comprising:
    injecting a gas including a source material containing silicon towards substrates received in a reaction chamber;
    depositing the source material on the substrates by generating plasma including oxygen radicals so as to form deposition films; and
    executing surface treatment on the deposition films by injecting plasma gas including oxygen radicals,
    wherein the substrates include gaps receiving the deposition films therein, and
    wherein, the surface treatment is executed on the deposition films on inner surfaces of the gaps and on outer surfaces at a vicinity of the gaps, and
    wherein, in the execution of the surface treatment, the plasma gas is injected more to react with the deposition films on upper parts of the inner surfaces than with the deposition films on lower parts of the inner surfaces so that the deposition films formed on the lower parts of the inner surfaces are thicker than the deposition films formed on the upper parts of the inner surfaces.

2. The substrate processing method according to claim 1, further comprising firstly judging whether or not the deposition films are formed to a predetermined thickness, after deposition.

3. The substrate processing method according to claim 2, further comprising firstly purging the inside of the reaction chamber by injecting purge gas into the reaction chamber, upon judging that the deposition films are formed to the predetermined thickness, after first judgment.

4. The substrate processing method according to claim 2, wherein, in first judgment, if the thickness of the deposition films is less than the predetermined thickness, the substrate processing method returns to injection.

5. The substrate processing method according to claim 1, further comprising, after surface treatment:
    secondarily purging the inside of the reaction chamber by injecting purge gas into the reaction chamber; and
    secondarily judging whether or not the deposition films form a plurality of layers in a predetermined number.

6. The substrate processing method according to claim 5, wherein, in second judgment, if the number of layers formed by the deposition films is less than the predetermined number, the substrate processing method returns to injection.

7. The substrate processing method according to claim 1, wherein the source material forms a silicon oxide and the deposition films are silicon oxide films.

8. The substrate processing method according to claim 1, wherein, in deposition, the deposition films are formed on the substrates using thermal deposition.

9. The substrate processing method according to claim 8, wherein the plasma is formed using at least one of $O_2$ and $O_3$.

10. The substrate processing method according to claim 1, wherein, in execution of surface treatment, the deposition films shrink so that the density of the deposition films is increased.

11. The substrate processing method according to claim 10, wherein execution of surface treatment is repeated until the deposition films reach predetermined density and step coverage.

12. The substrate processing method according to claim 1, wherein the deposition films form a plurality of layers on the surfaces of the gaps to fill the gaps by executing injection, deposition and surface treatment.

13. The substrate processing method according to claim 1, wherein the substrates provided in plural are processed within one reaction chamber.

14. The substrate processing method according to claim 13, wherein the reaction chamber includes:
    a substrate support unit rotated and having a plurality of substrates symmetrically mounted thereon;
    a lid spaced from an upper surface of the substrate support unit;
    gas injection units installed on the lid; and
    a plasma generation unit installed on the lid so as to be separated from the gas injection units.

15. The substrate processing method according to claim 14, wherein the gas injection units include:
    a first injection unit configured to inject the gas including the source material; and
    a second injection unit configured to divide the space of the reaction chamber and to inject gas for purging the reaction chamber.

16. The substrate processing method according to claim 1, wherein the deposition films formed on the lower parts of the inner surfaces are thicker than the deposition films formed on the outer surfaces.

* * * * *